(12) United States Patent
Wang

(10) Patent No.: US 7,390,108 B1
(45) Date of Patent: Jun. 24, 2008

(54) LED SOURCE FOR LIQUID CRYSTAL DISPLAY

(75) Inventor: Xinxin Wang, Naperville, IL (US)

(73) Assignee: CMC Electronics, Inc. (CA)

( * ) Notice: Subject to any disclaimer, the term of this patent is extended or adjusted under 35 U.S.C. 154(b) by 269 days.

(21) Appl. No.: 10/981,385

(22) Filed: Nov. 4, 2004

Related U.S. Application Data

(60) Provisional application No. 60/516,992, filed on Nov. 4, 2003.

(51) Int. Cl.
*F21V 29/00* (2006.01)
*F21S 13/14* (2006.01)

(52) U.S. Cl. .................................... 362/294; 362/252

(58) Field of Classification Search ................ 362/236, 362/252, 294, 373, 555, 800
See application file for complete search history.

(56) References Cited

U.S. PATENT DOCUMENTS

| | | | |
|---|---|---|---|
| 4,764,984 A | 8/1988 | Franke et al. ............... 398/119 |
| 6,419,372 B1 | 7/2002 | Shaw et al. ................. 362/231 |
| 6,469,822 B1 | 10/2002 | Zhu ........................... 359/316 |
| 6,512,231 B1 | 1/2003 | Moy .......................... 250/368 |
| 6,655,825 B2 * | 12/2003 | Muthu et al. ................ 362/561 |
| 6,789,921 B1 * | 9/2004 | Deloy et al. ................ 362/252 |
| 7,025,474 B2 * | 4/2006 | Campbell et al. ........... 362/231 |
| 7,036,946 B1 * | 5/2006 | Mosier ....................... 362/27 |
| 7,108,396 B2 * | 9/2006 | Swaris et al. ............... 362/249 |
| 2003/0007087 A1 | 1/2003 | Hakamata et al. .......... 348/370 |
| 2005/0243576 A1 * | 11/2005 | Park et al. .................. 362/612 |
| 2006/0139932 A1 * | 6/2006 | Park .......................... 362/294 |

OTHER PUBLICATIONS

"Luxeon DCC Application Brief AB27 for LCD Backlighting", Lumileds, pp. 1-37, Nov. 2004.
"High Brightness Direct LED Backllight for LCD-TV", SID 03 Digest, West et al.

\* cited by examiner

*Primary Examiner*—John A Ward
(74) *Attorney, Agent, or Firm*—Bromberg & Sunstein LLP

(57) ABSTRACT

An LED source for a liquid crystal display includes a heat sink having a top surface and a first side surface and a plurality of LEDs arranged in a row. Each LED includes a base and a first lead and is disposed such that the base of each LED contacts the top surface of the heat sink. A first circuit board is disposed such that the first circuit board contacts the first side surface of the heat sink.

25 Claims, 8 Drawing Sheets

LED SOURCE FOR LIQUID CRYSTAL DISPLAY

The present application claims priority from U.S. Provisional Application No. 60/516,992, filed Nov. 4, 2003, which is incorporated herein, in its entirety, by reference.

TECHNICAL FIELD

The present invention relates to a compact high power LED source with a very low thermal resistance, and its usage for sunlight readable and night vision image system compatible LCD display.

BACKGROUND ART

A typical commercial available Liquid Crystal Display ("LCD") as shown in FIG. 6 uses one or more fluorescent lamps 601 as its light source. A light guide 603 projects light from these fluorescent lamps 601 through the LCD screen based on the principle of total internal reflection. Typically, a wedged light guide is used when the lamp or lamps are located only at one side of the display and a parallel light guide is used when the lamps are located at two opposite sides of the display. Usually, there is also one or multiple driver boards 705 (see FIG. 7) located behind the light guide to control the operation of the LCD.

High powered Light Emitting Diodes ("LEDs"—for example Luxeon 1, 3 and 5 watt LEDs manufactured by Lumileds) are available for a backlight for sunlight readable LCD. With energy efficiency over 20 lumens per watt, these LEDs can provide more than a hundred of lumens of light output from a compact package. Because these LEDs have a very high power density, a significant amount of heat is generated. Thermal management becomes one of the most critical factors in LED source design.

Typically, the above mentioned LED has an anode and a cathode lead spreading horizontally for conducting electrical current in or out from the device as well as a metallic bottom slug for heat transfer. Conventionally, the LED is soldered to a metal core printed circuit board, which is parallel to the bottom surface of the metallic slug of the LED. The printed circuit board is then bonded to a large heat sink. Since there is a printed circuit board between the LED and the heat sink, the overall thermal resistance is increased. The cost of the metal core printed circuit board is high, and the width of the final assembly is wider than the total width of the LED.

Night Vision Image Systems ("NVIS") that are compatible with such sunlight readable LCDs are also known in the art. Normally, in order to combine a sunlight (or daylight) readable LCD with a NVIS, existing fluorescent lamps and light guides associated with a commercial off-the-shelf LCD display are removed, and replaced with a diffuser and an array of LEDs. In many cases, the LCD driver board must be relocated to make room for the LED array. Such an approach requires significant repackaging work and adds considerable cost to the display manufacturing process. Furthermore, internal cooling fans or heat sinks are required to remove the heat generated by the LED array. This also increases the depth and bulk of the display.

SUMMARY OF THE INVENTION

In a first embodiment of the invention, an LED source for a liquid crystal display includes a heat sink having a top surface and a first side surface and a plurality of LEDs arranged in a row. Each LED includes a base and a first lead and the plurality of LEDs is disposed such that the base of each LED contacts the top surface of the heat sink. A first circuit board is disposed such that the first circuit board contacts the first side surface of the heat sink.

In accordance with a related embodiment, the first side surface may include a first plurality of light transmittance areas. In accordance with another related embodiment, the first circuit board may include a second plurality of light transmittance areas that align with the first plurality of light transmittance areas. In accordance with a further related embodiment, the first lead of each LED may contact the first circuit board.

In accordance with other related embodiments, the plurality of LEDs may be affixed to top surface of the heat sink via thermally conductive and electrically insulated epoxy and/or a reflective surface may be disposed in each of the first plurality of light transmittance areas for reflecting light directed thereat. Each reflective surface may be disposed approximately 45 degrees with respect to the top surface of the heat sink. The first lead may be constructed from copper or aluminum. Further, the heat sink may include a second side surface and a second circuit board may be disposed such that second circuit board contacts the second side surface. Each LED may include a second lead and the second lead may contact the second circuit board.

In accordance with another embodiment of the invention, a liquid crystal display includes a first LED source and a second LED source. The first LED source includes a heat sink having a top surface and at least one side surface. The at least one side surface has a first plurality of light transmittance areas. Each of the first plurality of light transmittance areas includes a reflective surface. A first plurality of LEDs are arranged in a row. Each LED includes a base and at least one lead. The base of each of the first plurality of LEDs is disposed such that it contacts the top surface of the heat sink. At least one circuit board includes a second plurality of light transmittance areas. The second plurality of light transmittance areas is disposed on the heat sink such that the second plurality of light transmittance areas align with the first plurality of light transmittance areas. The at least one lead of each LED contacts the at least one circuit board. The second LED source is disposed such that light emitted from the second LED source is received by the reflective surfaces of the first LED source.

In accordance with a related embodiment, the bases of the first plurality of LEDs may be affixed to the top surface of the heat sink via thermally conductive and electrically insulated epoxy. In accordance with another related embodiment, the liquid crystal display may include a main heat sink for receiving heat from the first and second LED sources. In accordance with a further related embodiment, the liquid crystal display may include a reflector for receiving light from the first LED source. In accordance with yet other related embodiment, the liquid crystal display may include a light guide for receiving light from the reflector. In accordance with another related embodiment, the liquid crystal display may include a screen for receiving light from the light guide. The second LED source may be a night vision image LED source.

In accordance with a further embodiment of the invention, a liquid crystal display includes an LED source having a plurality of LEDs arranged in a row. Each of the plurality of LEDs includes a base and at least one lead. A heat sink has a top surface and at least one side surface, the at least one side surface having a first plurality of light transmittance areas, and at least one circuit board contacts the at least one side surface of the heat sink. The at least one circuit board includes a second plurality of light transmittance areas which align with the first plurality of light transmittance areas. The at least one lead of each LED is disposed such that it contacts the at least one circuit board. A reflector receives light from the LED source and a light guide receives light from the reflector. A screen receives light from the light guide. In accordance with a related embodiment, the plurality of LEDs may be affixed to the top surface of heat sink via thermally conductive and electrically insulated epoxy.

In accordance with another embodiment of the invention, a method for constructing a sunlight readable and night vision image system adaptable liquid crystal display includes removing a lamp from a liquid crystal display, the liquid crystal display having a screen and a wedged light guide, and placing a reflector in the liquid crystal display such that light from the reflector impinges on the wedged light guide. A first LED source is placed in the liquid crystal display such that light from the first LED source impinges on the reflector and a second LED source is placed in the liquid crystal display such that light from the second LED source impinges on reflective surfaces in the first LED source. The first LED source includes a heat sink having a top surface and a side surface. The side surface includes a first plurality of light transmittance areas. The first LED source also includes a plurality of LEDs arranged in a row, each of the plurality of LEDs including a base and a lead, each base being disposed such that it contacts the top surface of heat sink. A circuit board having a second plurality of light transmittance areas is disposed such that the second plurality of light transmittance areas align with the first plurality of light transmittance areas and such that the lead of each LED contacts the circuit board. A reflective surface is disposed in each of the first plurality of light transmittance areas for reflecting light directed thereat.

In accordance with a related embodiment, placing a second LED source in the liquid crystal display may include placing a night vision image LED source in the liquid crystal display. Placing a night vision image LED source in the liquid crystal display may include placing a night vision image LED source that includes a second plurality of LEDs arranged in one row on a back piece and a body having a plurality of recesses for receiving the plurality of LEDs. The second LED source may also includes a night vision image filter disposed such that that the night vision image filter receives light from the second plurality of LEDs. The night vision LED source may also include a front piece affixed to the body adjacent the night vision image filter. The second plurality of LEDs may be affixed to the back piece via thermally conductive and electrically insulated epoxy, and the back piece may include a circuit board.

In accordance with a further embodiment of the invention, a light source for a liquid crystal display includes a heat sink having a top surface, a side surface and a plurality of reflective surfaces for redirecting light received at the side surface through the top surface. A first array of LEDs, arranged in a row, is in thermal contact with the top surface of the heat sink and a second array of LEDs is arranged such that they illuminate the reflective surfaces through the side surface of the heat sink.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

The present invention provides an efficient way to conduct heat from an LED in a LCD to a large heat sink while maintaining compactness of the LCD.

In accordance with an embodiment of the invention, a commercial "off-the-shelf" LCD is converted into a sunlight (or daylight) readable and NVIS compatible display with minimum repackaging, so that the cost of the manufacturing the display can be minimized. An existing wedged light guide and the LCD driver board along with its connection to the LCD are kept unchanged during the conversion. Examples of off-the-shelf LCDs having wedged light guides include the Toshiba L™08C351, the NEC NL8060BC26 and the Sharp LQ104S1DG21 displays. A thin reflector and a compact, high power linear light source may be used to directly replace the existing fluorescent light source without altering other parts of a commercial LCD display. The LED source comprises a plurality of high power white LEDs.

Figure 1:
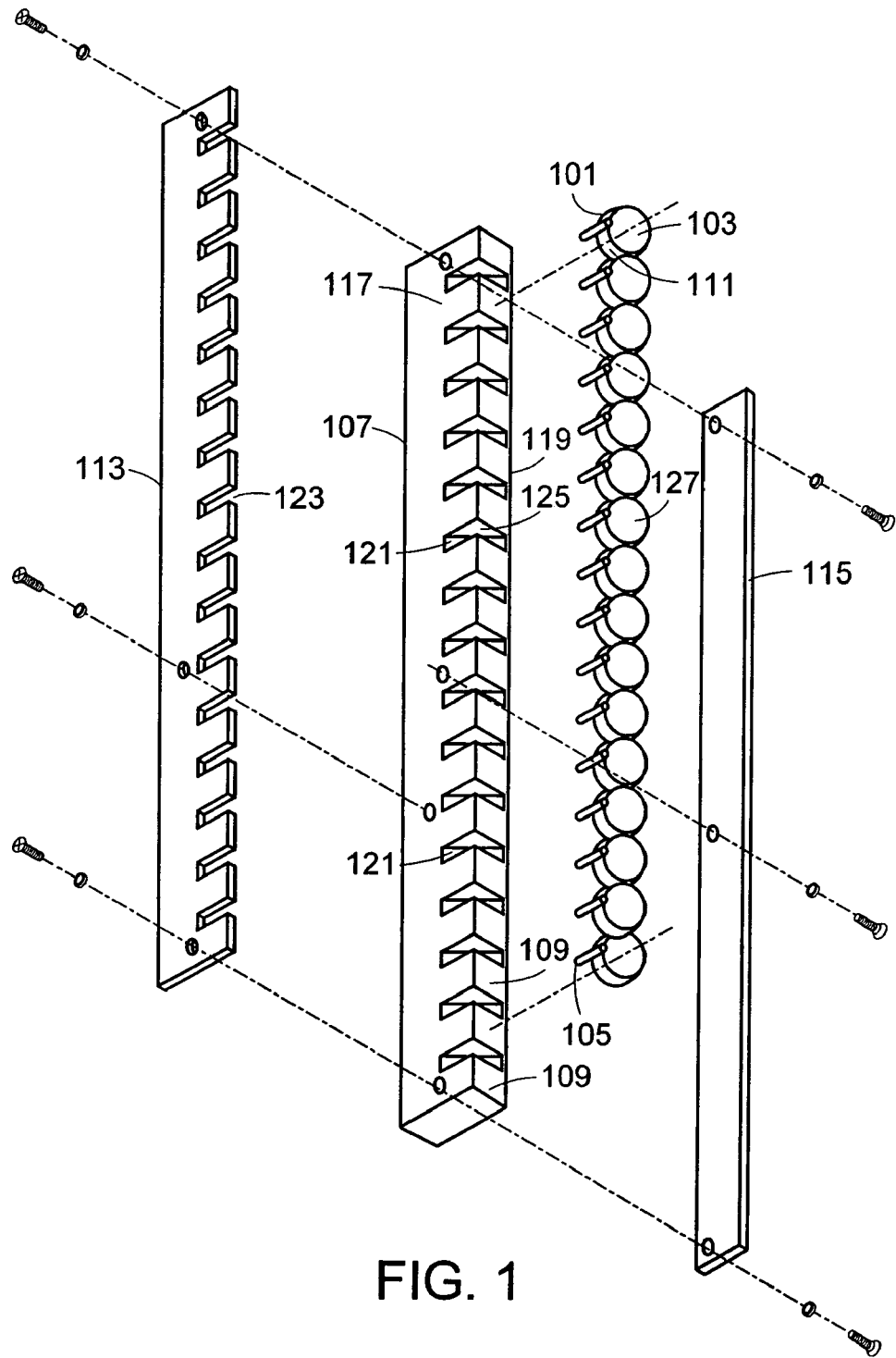
FIG. 1 is an exploded view of a LED source for a liquid crystal display in accordance with one embodiment of the invention.
Figure 2:
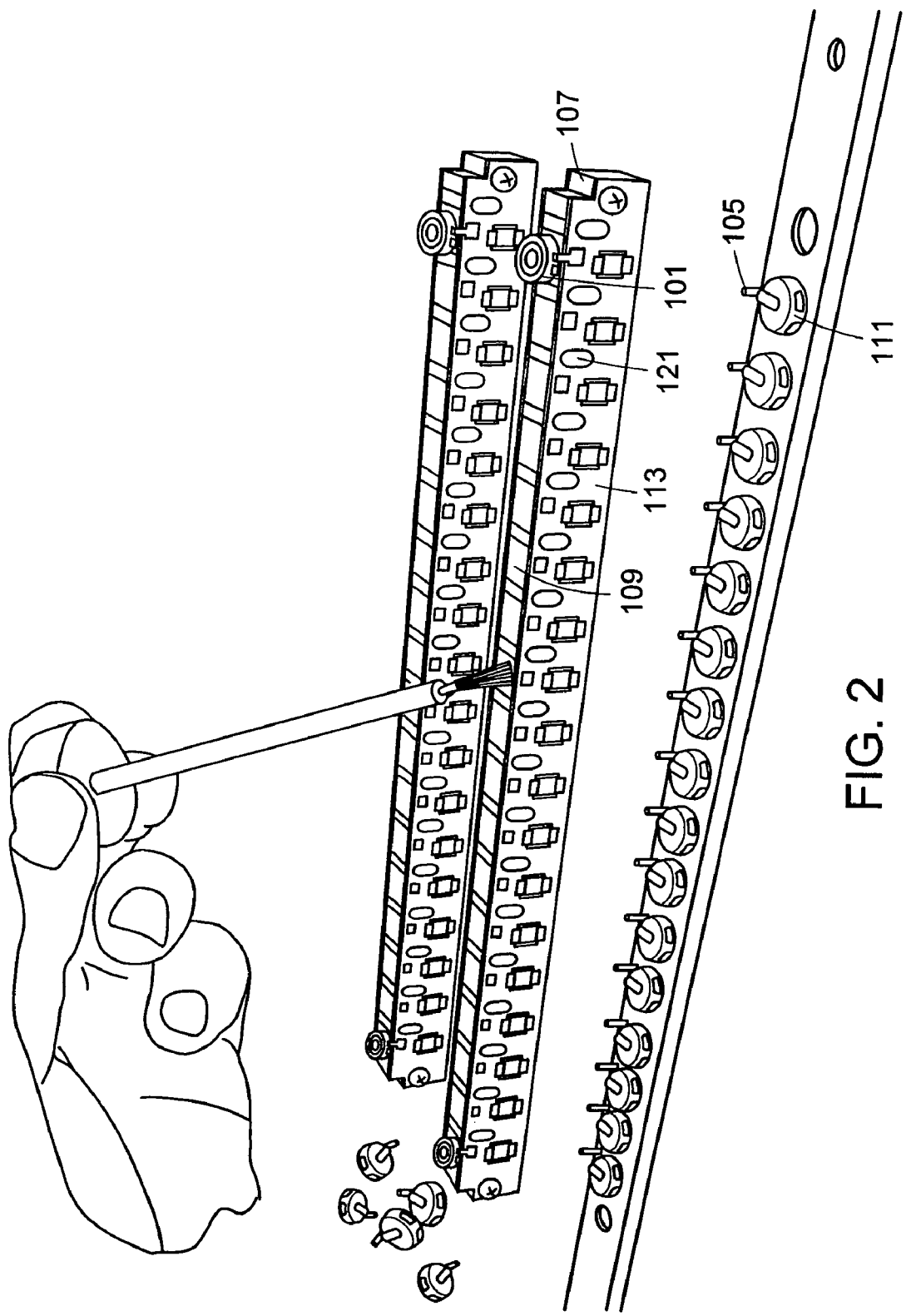
FIG. 2 is an illustration of a method of assembling the LED source of FIG. 1.
Figure 3:
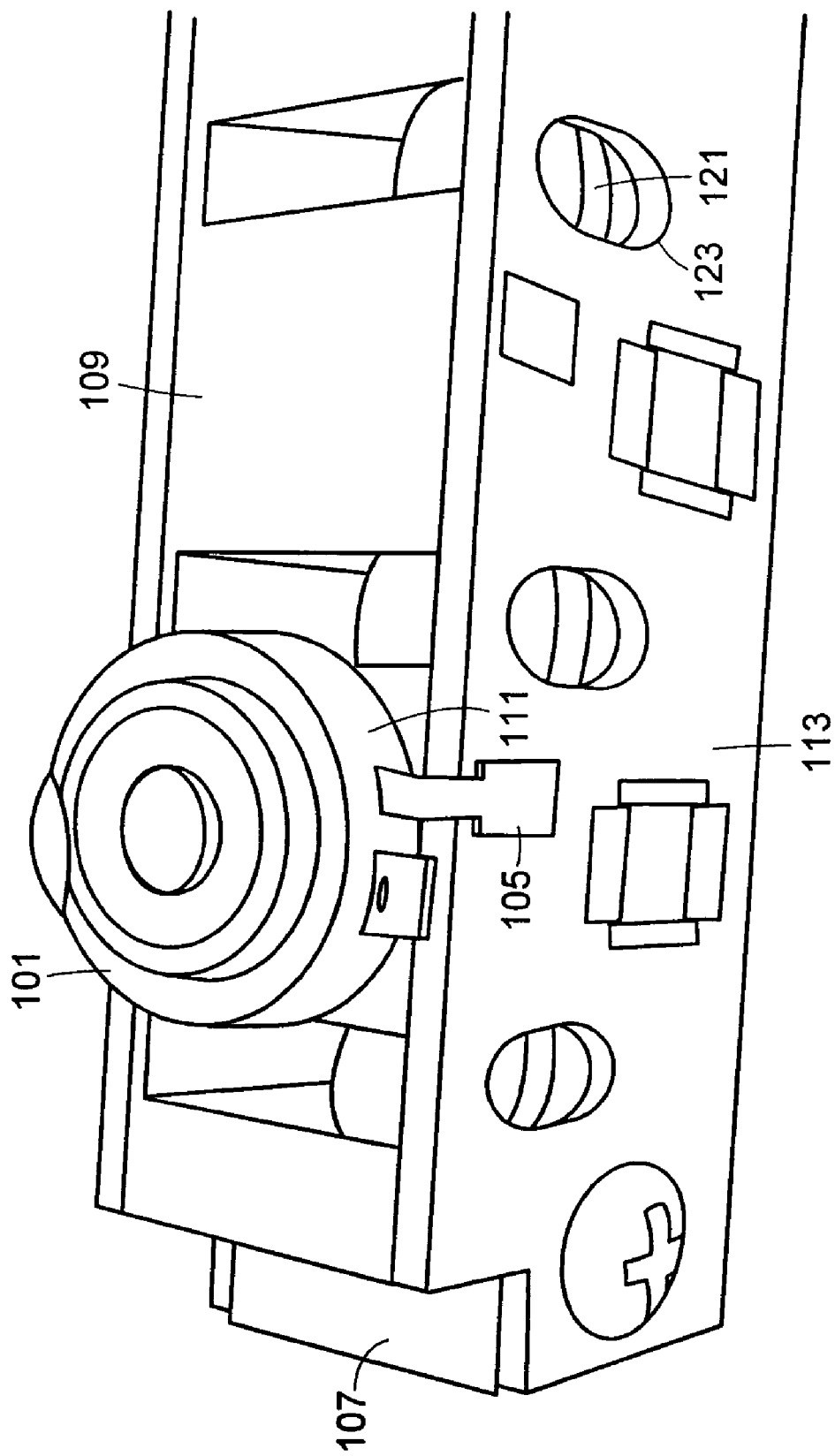
FIG. 3 is an illustration of the LED source of FIG. 1 assembled.

As shown in FIG. 1 a LED source for a sunlight readable liquid crystal display includes a row (or linear array) of LEDs 101 which may be white LEDs such as those manufactured by Lumileds mentioned above. Each LED includes an illuminating surface 103, a base 111 (typically metallic) and at least one lead 105 which is disposed such that it contacts at least one circuit board 113 and 115. In accordance with one embodiment, the leads 105 are disposed such that they are substantially 90 degrees to a top surface 127 of the base 111. The leads 105 may be made of copper, aluminum or other conductive metal. As shown in FIGS. 2 and 3, the LEDs 101 are mounted to one surface of a heat sink 107. The heat sink 107 may constructed from any conductive material, for example, copper or aluminum and may include light transmittance areas 125. Light transmittance areas may be slots, recesses or solids or any other media through which light may pass. In accordance with one embodiment of the invention, the LEDs are directly bonded to the top surface 109 of the heat sink 107 using thermally conductive and electrically insulated epoxy, such as Locktite 3873 (see FIGS. 2 and 3). Further, activator Locktite 7387 may be used to provide a quicker setting time under room temperature. The epoxy may contain small glass spheres approximately 0.005" in diameter, which prevent the LED base 111 from directly contacting the top surface 109 of the heat sink. This is to avoid an electrical connection between the bases of multiple LEDs mounted to the same heat sink.

The width of the top surface of the heat sink may be approximately equal to, or just slightly wider than, that of the base of the LED 111. One or more printed circuit boards 113 and 115 are mounted to at least one side of the heat sink 107. In accordance with the embodiment illustrated, the circuit boards 113 and 115 are mounted to the sides (117 and 119 respectively) of the heat sink 107. The surfaces of these printed circuit boards 113 and 115 are approximately perpendicular to the bottom surface of the base 111 of the LED. The total width of the heat sink 107 and the circuit boards 113 and 115 is slightly wider than the body of the LED 101. At least one LED lead 105 is bent down approximately 90 degrees, such it contacts the circuit board. In accordance with the embodiment shown in FIG. 1, each LED includes two leads and each lead is bent as described above such that they contact the circuit boards 113 and 115 respectively. Since the LED base 111 is directly bonded to the heat sink 107, thermal resistance is minimized. Further, because the leads 105 of the LEDs 101 are bent down, the total width of this LED source is narrower than that of the original LED. The printed circuit boards 113 and 115 may be single layer boards rather than an expensive metal core boards. Therefore, the cost of the printed circuit boards is also reduced and, since there is no need for internal fans, the overall depth of the LED source can be minimized.

As shown in FIG. 1, the left side printed circuit board 113 includes a first portion of driving circuitry for the LEDs and a plurality of light transmittance areas (such as elongated recesses or slots) 123. The right side printed circuit board 115 includes a second portion of driving circuitry for the LEDs. A plurality of reflective surfaces 121 disposed in light transmittance areas 125 on the heat sink (or constructed as part of the heat sink) are located between the LEDs 101. The reflective surfaces 121 may be approximately 45 degrees with respect the top surface 109 of the heat sink, in alignment with light transmittance areas 123 of the left side printed circuit board 113. A plurality of NVIS filters may be placed next to the left side printed circuit board, covering the light transmittance areas 123. A plurality of secondary LEDs may face the NVIS filters, such that the secondary LEDs are used as an NVIS light source and for color correction.

By using the LED sources of the present invention it is also possible to convert a commercial LCD with a parallel light guide and fluorescent lamps at two opposite sides of the display into sunlight readable and NVIS compatible display. (An example of an LCD having a parallel light guide is a NEC NL6448BC20.) After removing the two fluorescent lamps and replacing the parallel light guide with a new wedged light guide (such as light guide CL-DAR-CMCA-6.4-W-H/D-CN manufactured by Clio Technologies) one can easily install the above mentioned LED source without altering the LCD driver board.

The invention of the present application may be used in many applications, including portable light sources, traffic lights, and automobile lights, as well as light source for an LCD display. Similarly, light sources in accordance with the present application may be use for any sunlight readable LCD for, for example, an ATM, point of sale device, avionics device and/or a light display requiring a wide operating temperature range and long service life.

Figure 4:
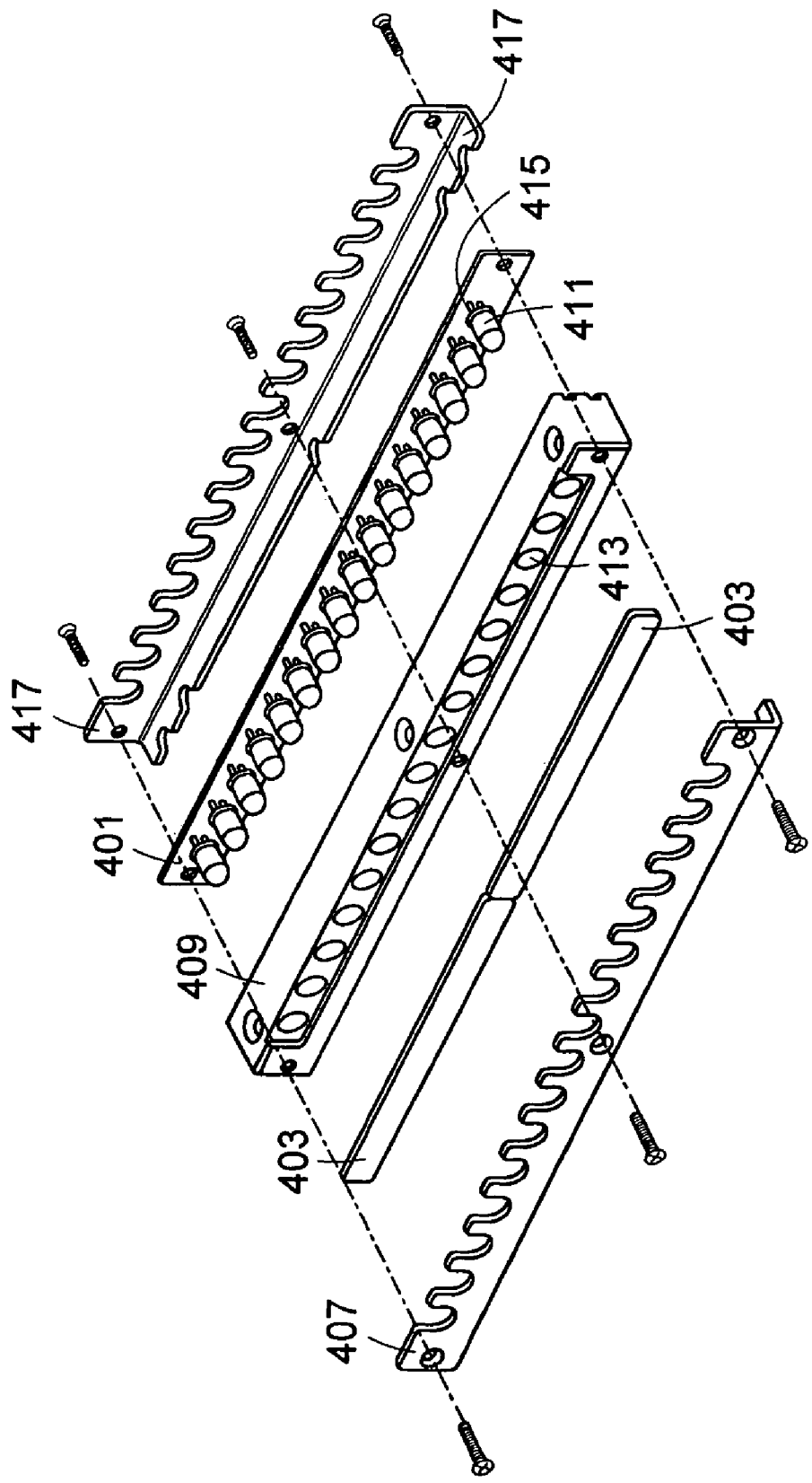
FIG. 4 is an exploded view of a LED source for a night vision image system for use in a liquid crystal display in accordance with another embodiment of the invention.

FIG. 4 is an exploded view of a LED source for a night vision image system for use in a liquid crystal display in accordance with another embodiment of the invention. In accordance with FIG. 4, includes a row (or linear array) of LEDs 411. Each LED includes leads 415. Here again, the leads 415 may be made of copper or other conductive metal. The LEDs 411 (which may be white LEDs, such as NSPW500BS manufactured by Nichia America Corporation) are mounted to a printed circuit board 401 with the LEDs 415 bonded to one surface of a back piece or holder 417 using thermally conductive and electrically insulated epoxy. A body 409, which may be constructed from aluminum, receives the LEDs 411 via a series of recess (or holes or slots) 413. Night vision image filters 403 (such as filter F0164-0011 manufactured by Wamco) is disposed on the body 409 in front of the LEDs 411 and a front piece or holder 407 is affixed (via screws or any other method) to the body 409.

Figure 5:
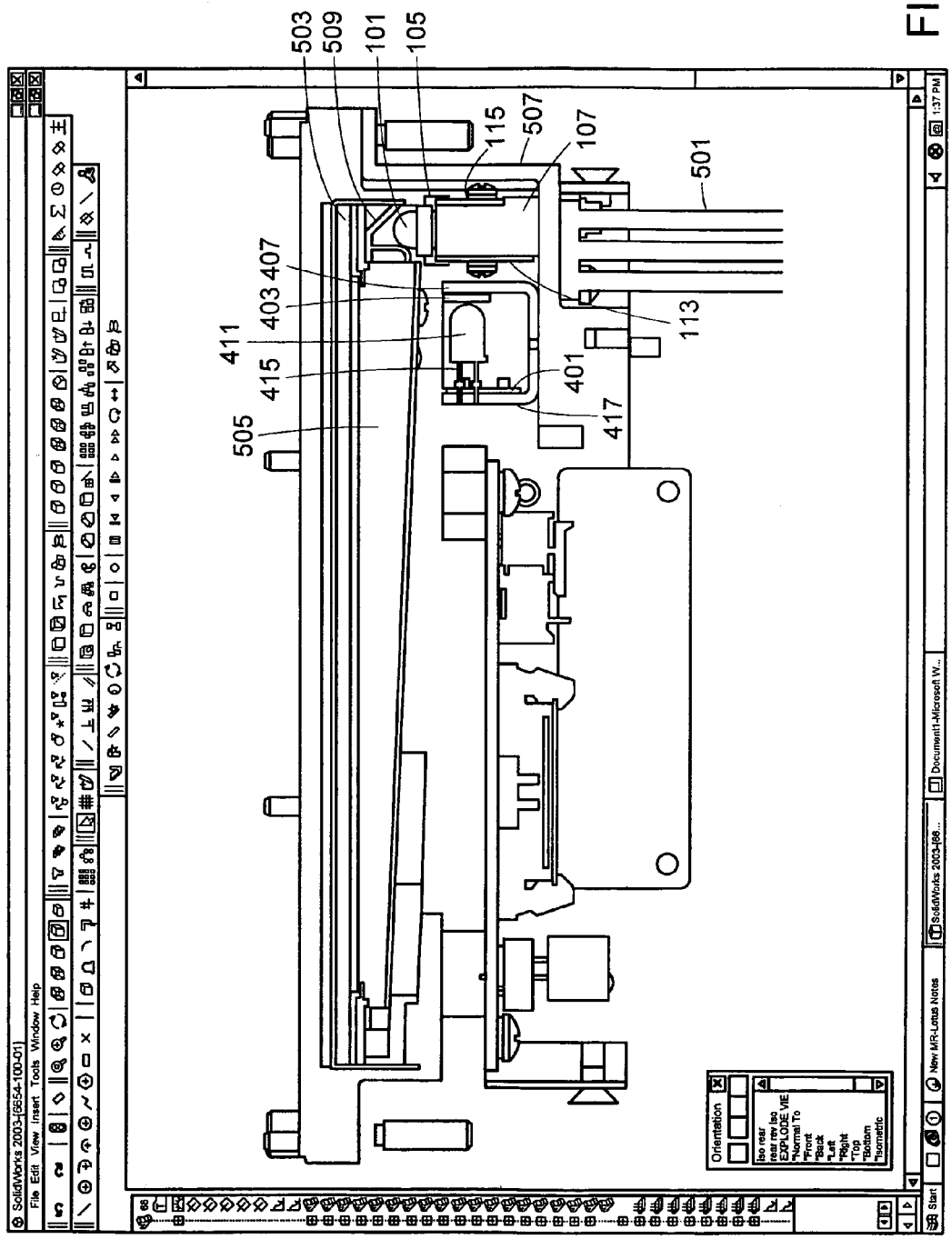
FIG. 5 is a graphical illustration of a liquid crystal display incorporating the LED sources of FIGS. 1 and 4 in accordance with a further embodiment of the invention.
Figure 6:
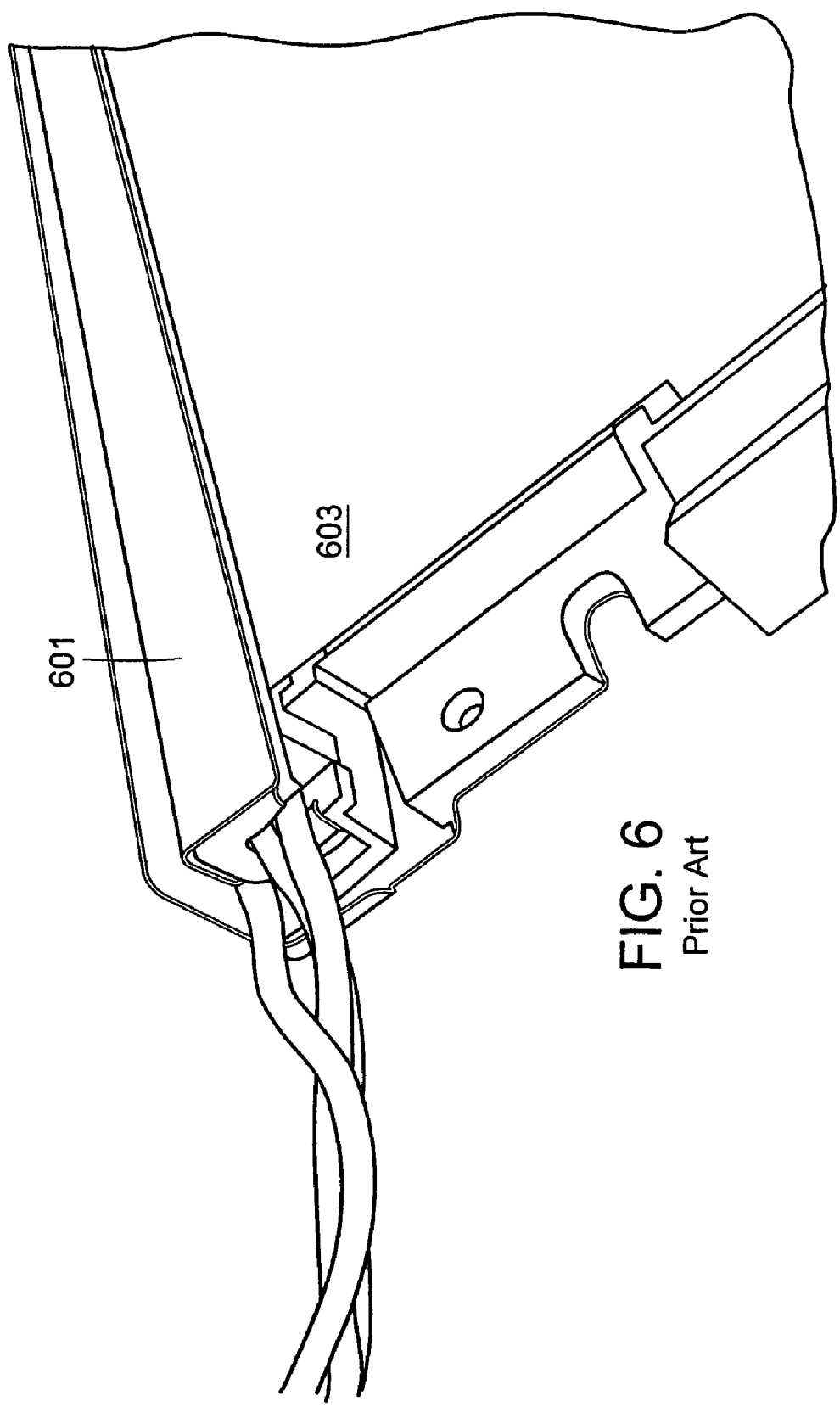
FIG. 6 is an illustration of a liquid crystal display as known in the prior art.
Figure 7:
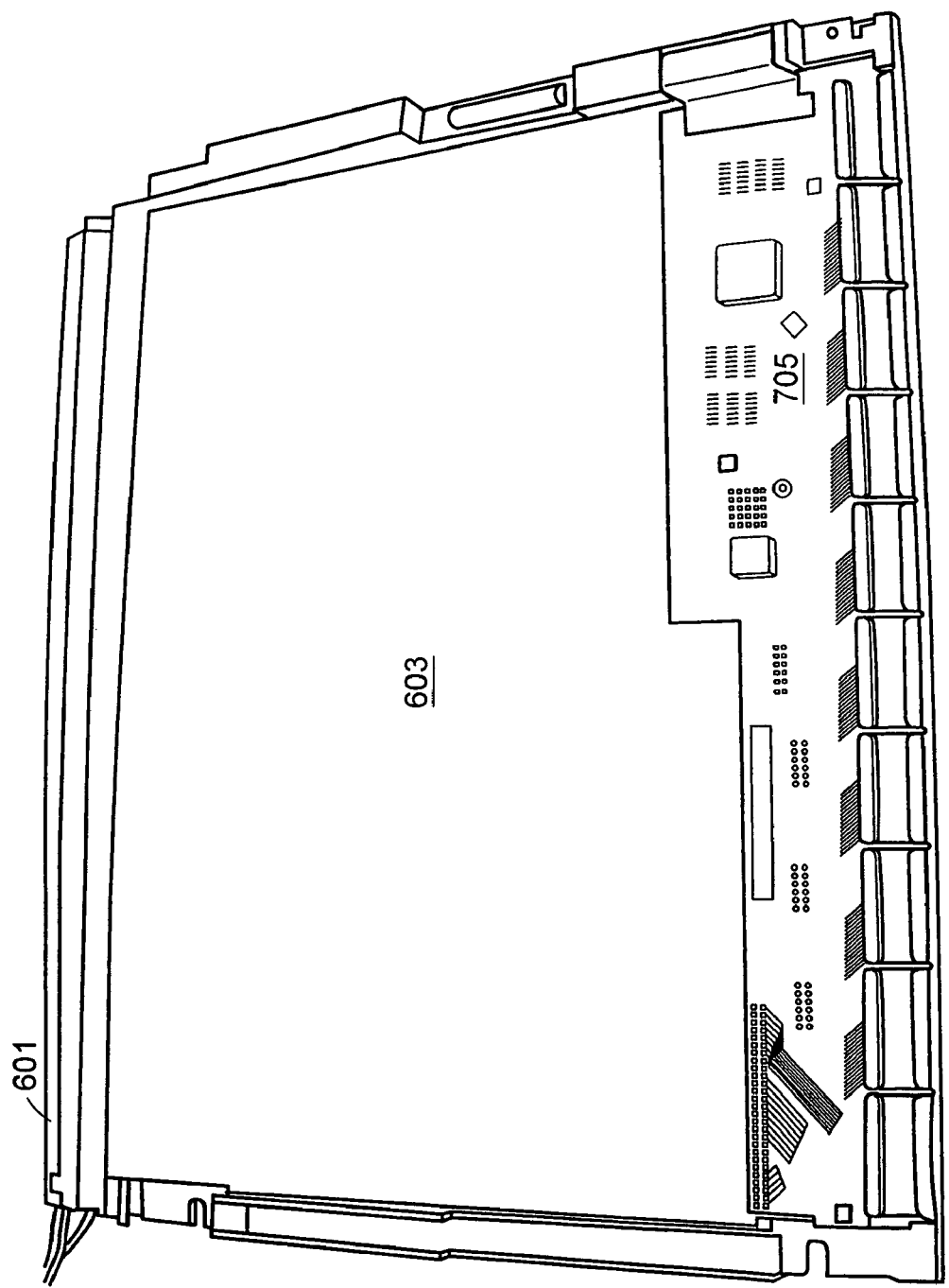
FIG. 7 is an illustration of the circuit board of the display of FIG. 6.

FIG. 5 is a graphical illustration of a liquid crystal display incorporating the LED sources of FIGS. 1 and 4. In accordance with this embodiment, an off-the-shelf LCD having a LCD screen 503 and a wedged light guide 505 as described above is employed. (A main heat sink 501 may be added to the LCD.) Typically, such a LCD includes a lamp (not shown) which is removed. A main reflector 509 is placed to the side of the wedged light guide 505. The sunlight readable LCD source described with respect to FIG. 1 is disposed beneath the main reflector 509 such that light from the LED 101 impinges on the main reflector 509. Light from the main reflector 509 will be refracted through the light guide 505 onto the screen 503. Heat from the sunlight LED source is absorbed by the main heat sink 501 through the enclosure wall 507. The night vision image LED source of FIG. 4 is disposed such that the light from the LCD 411 impinges on the reflective surfaces 121 of the sunlight readable LED source and travels to the main reflector 509 and to the light guide 505 as described above.

Figure 8:
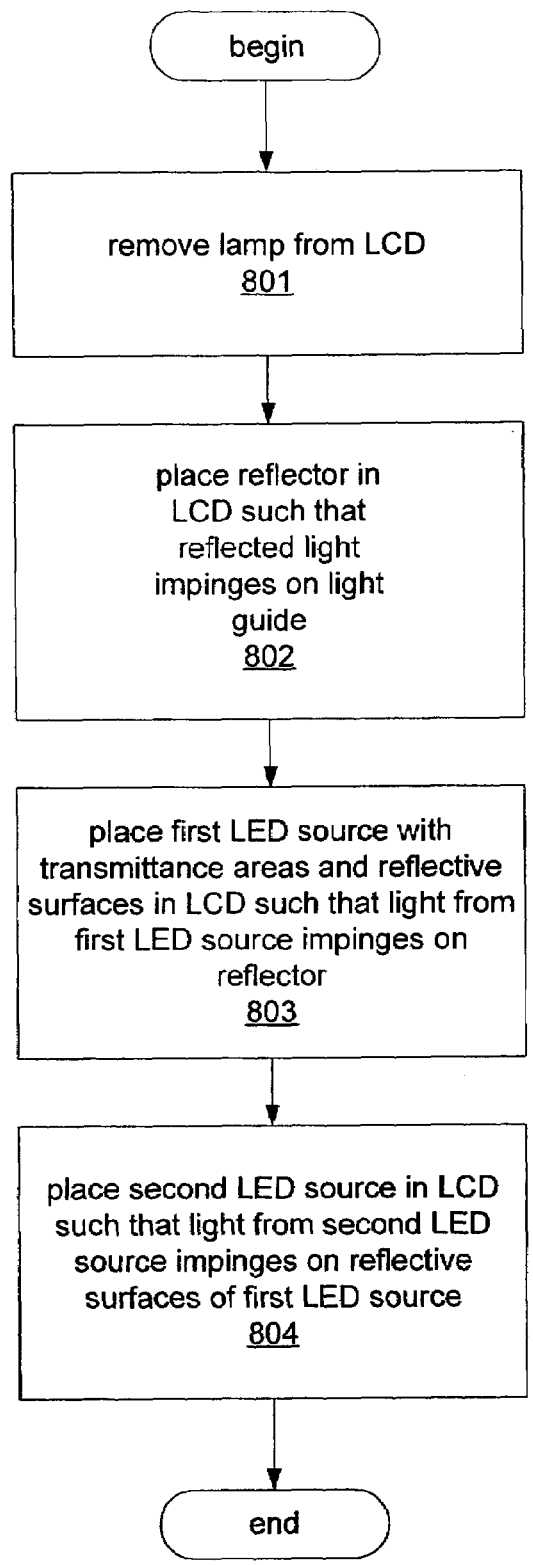
FIG. 8 is a flow chart illustrating a method for constructing a sunlight readable and night vision image system adaptable liquid crystal display in accordance with a further embodiment of the invention.

FIG. 8 is a flow chart illustrating method for constructing a sunlight readable and night vision image system adaptable liquid crystal display in accordance with a further embodiment of the invention. In process 801, a lamp is removed from a liquid crystal display that includes a screen and a wedged light guide. A reflector is placed 802 in the liquid crystal display such that light from the reflector source impinges on the wedged light guide, and a LED as described with respect to FIG. 1 is placed 803 such that light from the LED source impinges on the reflector. A second LED source (which may be a night vision image system) is placed 804 in the liquid crystal display such that light from the second LED source impinges on the reflective surfaces of the first LED source. The second LED source may be as described above with respect to FIG. 4.

While the invention has been described in connection with specific embodiments thereof, it will be understood that it is capable of further modification. For example, the night vision image system need not be added to the LCD, but rather, the sunlight readable LED source may stand on its own in the LCD. This application is intended to cover any variation, uses, or adaptations of the invention and including such departures from the present disclosure as come within known or customary practice in the art to which invention pertains.

What is claimed is:

1. An LED source for a liquid crystal display, the LED source comprising:
    a heat sink having a top surface and a first side surface, the first side surface including a first plurality of light transmittance areas, each of the first plurality of light transmittance areas including a reflective surface;
    a plurality of LEDs arranged in a row, each LED including a base and a first lead, the plurality of LEDs disposed such that the base of each LED contacts the top surface of the heat sink; and
    a first circuit board, the first circuit board disposed such that the first circuit board contacts the first side surface of the heat sink.

2. An LED source according to claim 1, wherein the first circuit board includes a second plurality of light transmittance areas that align with the first plurality of light transmittance areas.

3. An LED source according to claim 1, wherein the first lead of each LED contacts the first circuit board.

4. An LED source according to claim 1, wherein the plurality of LEDs is affixed to the top surface of the heat sink via thermally conductive and electrically insulated epoxy.

5. An LED source according to claim 1, wherein each reflective surface is disposed approximately 45 degrees with respect to the top surface of the heat sink.

6. An LED source according to claim 1, wherein the first lead is constructed from copper.

7. An LED source according to claim 1, wherein the heat sink is constructed from aluminum.

8. An LED source according to claim 1, wherein the heat sink includes a second side surface and wherein a second circuit board is disposed such that the second circuit board contacts the second side surface.

9. An LED source according to claim 8, wherein each LED includes a second lead and wherein the second lead contacts the second circuit board.

10. A liquid crystal display comprising:
a first LED source, the first LED source comprising:
a heat sink having a top surface and at least one side surface, the at least one side surface having a first plurality of light transmittance areas, each of the first plurality of light transmittance areas including a reflective surface,
a first plurality of LEDs arranged in a row, each LED including a base and at least one lead, the base of each of the first plurality of LEDs being disposed such that it contacts the top surface of the heat sink,
at least one circuit board, the at least one circuit board including a second plurality of light transmittance areas, the at least one circuit board disposed on the heat sink such that the second plurality of light transmittance areas align with the first plurality of light transmittance areas and such that the at least one lead of each LED contacts the at least one circuit board; and
a second LED source, the second LED source disposed such that light emitted from the second LED source is received by the reflective surfaces of the first LED source.

11. A liquid crystal display according to claim 10, wherein the bases of the first plurality of LEDs are affixed to the top surface of the heat sink via thermally conductive and electrically insulated epoxy.

12. A liquid crystal display according to claim 10, further comprising a main heat sink for receiving heat from the first and second LED sources.

13. A liquid crystal display according to claim 10, further comprising a reflector for receiving light from the first LED source.

14. A liquid crystal display according to claim 10, further comprising a light guide for receiving light from the reflector.

15. A liquid crystal display according to claim 14, further comprising a screen for receiving light from the light guide.

16. A liquid crystal display according to claim 14, wherein the second LED source is a night vision image LED source.

17. A liquid crystal display comprising:
an LED source having a plurality of LEDs arranged in a row, each of the plurality of LEDs having a base and at least one lead, and a heat sink having a top surface and at least one side surface, the at least one side surface having a first plurality of light transmittance areas, each of the first plurality of light transmittance areas including a reflective surface;
at least one circuit board disposed such that it contacts the at least one side surface of the heat sink, the at least one circuit board having a second plurality of light transmittance areas which align with the first plurality of light transmittance areas, the at least one lead of each LED disposed such that it contacts the at least one circuit board;
a reflector for receiving light from the LED source;
a light guide for receiving light from the reflector; and
a screen for receiving light from the light guide.

18. A liquid crystal display according to claim 17, wherein the plurality of LEDs are affixed to the top surface of heat sink via thermally conductive and electrically insulated epoxy.

19. A method for constructing a sunlight readable and night vision image system adaptable liquid crystal display, the method comprising:
removing a lamp from a liquid crystal display, the liquid crystal display having a screen and a wedged light guide;
placing a reflector in the liquid crystal display such that light from the reflector impinges on the wedged light guide;
placing a first LED source in the liquid crystal display such that light from the first LED source impinges on the reflector, the first LED source comprising:
a heat sink, the heat sink including a top surface and a side surface, the side surface having a first plurality of light transmittance areas,
a plurality of LEDs arranged in a row, each of the plurality of LEDs including a base and a lead, each base being disposed such that it contacts the top surface of the heat sink,
a circuit board having a second plurality of light transmittance areas, the circuit board being disposed such that the second plurality of light transmittance areas align with the first plurality of light transmittance areas and such that the lead of each LED contacts the circuit board, and
a reflective surface disposed in each of the first plurality of light transmittance areas for reflecting light directed thereat; and
placing a second LED source in the liquid crystal display such that light from the second LED source impinges on the reflective surfaces of the first LED source.

20. A method according to claim 19, wherein placing a second LED source in the liquid crystal display includes placing a night vision image LED source in the liquid crystal display.

21. A method according to claim 20, wherein placing a night vision image LED source in the liquid crystal display includes placing a night vision image LED source comprising:
a second plurality of LEDs arranged in one row on a back piece,
a body having a plurality of recesses for receiving the second plurality of LEDs, and
a night vision image filter disposed such that the night vision image filter receives light from the second plurality of LEDs.

22. A method according to claim 21, wherein the night vision LED source further includes a front piece affixed to the body adjacent the night vision image filter.

23. A method according to claim 21, wherein the second plurality of LEDs is affixed to the back piece via thermally conductive and electrically insulated epoxy.

24. A method according to claim 21, wherein the back piece includes a circuit board.

25. A light source for a liquid crystal display comprising:
a heat sink having a top surface and a side surface the side surface including a plurality of light transmittance areas each of the plurality of light transmittance areas including a reflective surface, the plurality of reflective surfaces disposed at an angle such that light normal to the side surface and received by the reflective surfaces is redirected through the top surface;
a first array of LEDs arranged in a row in thermal contact with the top surface of the heat sink; and
a second array of LEDs arranged such that they illuminate the reflective surfaces through the side surface of the heat sink.

* * * * *

UNITED STATES PATENT AND TRADEMARK OFFICE
CERTIFICATE OF CORRECTION

PATENT NO. : 7,390,108 B1  Page 1 of 1
APPLICATION NO. : 10/981385
DATED : June 24, 2008
INVENTOR(S) : Xinxin Wang It is certified that error appears in the above-identified patent and that said Letters Patent is hereby corrected as shown below:

In Col. 9, line 4
replace "a side surface the side"
with --a side surface, the side--

In Col. 9, lines 5 and 6
replace "light transmittance areas each"
with --light transmittance areas, each--

Signed and Sealed this

Nineteenth Day of August, 2008

JON W. DUDAS
*Director of the United States Patent and Trademark Office*